(12) United States Patent
Wang et al.

(10) Patent No.: US 12,554,204 B2
(45) Date of Patent: Feb. 17, 2026

(54) LITHOGRAPHIC APPARATUS, SUBSTRATE TABLE, AND MANUFACTURING METHOD

(71) Applicant: ASML Netherlands B.V., Veldhoven (NL)

(72) Inventors: Hao-Chih Wang, Bronxville, NY (US); Samira Farsinezhad, Norwalk, CT (US); Sotrios Lyrintzis, Danbury, CT (US); Keane Michael Levy, Wilton, CT (US)

(73) Assignee: ASML Netherlands B.V., Veldhoven (NL)

( * ) Notice: Subject to any disclaimer, the term of this patent is extended or adjusted under 35 U.S.C. 154(b) by 75 days.

(21) Appl. No.: 18/572,449

(22) PCT Filed: Jun. 13, 2022

(86) PCT No.: PCT/EP2022/066041
§ 371 (c)(1),
(2) Date: Dec. 20, 2023

(87) PCT Pub. No.: WO2022/268559
PCT Pub. Date: Dec. 29, 2022

(65) Prior Publication Data
US 2025/0130508 A1    Apr. 24, 2025

Related U.S. Application Data

(60) Provisional application No. 63/213,456, filed on Jun. 22, 2021.

(51) Int. Cl.
*G03F 7/00* (2006.01)

(52) U.S. Cl.
CPC ......... *G03F 7/70708* (2013.01); *G03F 7/707* (2013.01); *G03F 7/70908* (2013.01); *G03F 7/7095* (2013.01)

(58) Field of Classification Search
CPC ............... G03F 7/70708; G03F 7/7095; G03F 7/70908; G03F 7/707; G03F 7/70783;
(Continued)

(56) References Cited

U.S. PATENT DOCUMENTS

| 7,511,799 B2 | 3/2009 | Tel et al. |
| 2005/0061995 A1 | 3/2005 | Vink et al. |

(Continued)

FOREIGN PATENT DOCUMENTS

| CN | 106480304 B | 4/2018 |
| CN | 110607432 A | 12/2019 |

(Continued)

OTHER PUBLICATIONS

International Search Report and Written Opinion of the International Searching Authority directed to International Patent Application No. PCT/EP2022/066041, mailed Oct. 20, 2022; 11 pages.

(Continued)

*Primary Examiner* — Christina A Riddle
(74) *Attorney, Agent, or Firm* — Sterne, Kessler, Goldstein & Fox P.L.L.C.

(57) ABSTRACT

A method includes treating a burled surface of an object using radiation or heat and setting parameters of the radiation or heat to effectuate a predetermined surface strength, hardness, roughness, coefficient of friction, chemical resistance, wear resistance, and/or corrosion of the burled surface.

12 Claims, 9 Drawing Sheets

(58) Field of Classification Search
CPC .. G03F 7/70975; G03F 7/701; G03F 7/70308;
G03F 7/706; G03F 7/70891; G03F
7/70925; G03F 7/70716; G03F 7/70725;
G03F 7/70733; G03F 7/70741; G03F
7/7075; G03F 7/70791; G03F 7/708;
G03F 7/70808; G03F 7/70816; G03F
7/70825; G03F 7/70841; G03F 7/7085;
G03F 7/70858; G03F 7/70866; G03F
7/70991; H01L 21/67225; H01L 21/6833;
H01L 21/6838; H01L 21/687; H01L
21/68735; H01L 21/6875; H01L
21/68757; B23K 2103/52; B23K 26/355;
B23K 26/402; B23K 2103/02; B23K
2103/08; B23K 2103/50; B23K 26/0006;
B23K 26/009; B23K 26/032; B23K
26/0622; B23K 26/0624; B23K 26/0876;
B23K 26/0884; B23K 26/10; B23K
26/123; B23K 26/14; B23K 26/1464;
B23K 26/342; B23K 26/352; B23K
26/356; B23K 26/36; B23K 26/361;
B23K 26/362; B23K 26/364; B23K
26/40; B23K 37/0235; B22F 10/28; B22F
10/38; B22F 10/50; B22F 12/10; B22F
12/43; B22F 12/44; B22F 12/45; B29C
64/153; B29C 64/188; B33Y 10/00;
B33Y 30/00; B33Y 40/00; C21D 1/38;
C21D 10/005; C21D 7/06
USPC .......................................... 355/18, 30, 72–77
See application file for complete search history.

(56) References Cited

U.S. PATENT DOCUMENTS

| 2006/0006340 | A1 | 1/2006 | Compen |
| 2010/0296073 | A1 | 11/2010 | Puyt et al. |
| 2016/0354864 | A1 | 12/2016 | Hammer et al. |
| 2017/0087670 | A1 | 3/2017 | Kalentics et al. |
| 2020/0230747 | A1 | 7/2020 | McDannald et al. |

FOREIGN PATENT DOCUMENTS

| CN | 111944989 A | 11/2020 |
| EP | 1 093 022 A2 | 4/2001 |
| JP | H06-223672 A | 8/1994 |
| WO | WO 2020/135971 A1 | 7/2020 |
| WO | WO 2020/169326 A1 | 8/2020 |

OTHER PUBLICATIONS

J.C. Betts, "Surface Engineering of Light Alloys—Chapter 13: Laser surface modification of aluminium and magnesium alloys," Dec. 2010; pp. 444-474.

Birnbaum et al., "Advances in Laser Materials Processing—Chapter 18: Advances in laser-induced plastic deformation processes," Mar. 27, 2014; pp. 535-572.

Dobrzanski et al., "Laser Surface Engineering—Chapter 1: Structures, properties and development trends of laser-surface-treated hot-work steels, light metal alloys and polycrystalline silicon," Oct. 10, 2014; pp. 3-32.

Fabbro et al., "Physics and applications of laser-shock processing," Journal of Laser Applications, vol. 10, No. 6, Nov. 3, 1998; pp. 265-279.

Muresan et al., "Intelligent Coatings for Corrosion Control—Chapter 17: Corrosion Protective Coatings for Ti and Ti Alloys Used for Biomedical Implants," Oct. 31, 2014; pp. 585-602.

"Lithographic Apparatus, Substrate Table, and Manufacturing Method," Research Disclosure No. 688043, Jul. 16, 2021; 32 pages.

Sundar R. et al., "Laser Shock Peening and its Applications: a Review," Lasers in Manufacturing and Materials Processing, vol. 6, Oct. 23, 2019; pp. 424-463.

Zhang et al., "Recent Developments and Novel Applications of Laser Shock Peening: a Review," Advanced Engineering Materials, vol. 23, Apr. 28, 2021; pp. 1-24.

LITHOGRAPHIC APPARATUS, SUBSTRATE TABLE, AND MANUFACTURING METHOD

CROSS-REFERENCE TO RELATED APPLICATIONS

This application claims priority of U.S. Provisional Patent Application No. 63/213,456, which was filed on Jun. 22, 2021, and which is incorporated herein in its entirety by reference.

FIELD

The present disclosure relates to substrate tables, textured table surfaces, and methods of implementing burls and nanostructures on substrate table surfaces for use in, for example, lithographic systems and processes.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, can be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the target portions parallel or anti-parallel to this scanning direction. It is also possible to transfer the pattern from the patterning device to the substrate by imprinting the pattern onto the substrate.

Another lithographic system is an interferometric lithographic system where there is no patterning device, but rather a light beam is split into two beams, and the two beams are caused to interfere at a target portion of the substrate through the use of a reflection system. The interference causes lines to be formed at the target portion of the substrate.

During lithographic operation, different processing steps may require different layers to be sequentially formed on the substrate. Accordingly, it can be necessary to position the substrate relative to prior patterns formed thereon with a high degree of accuracy. Generally, alignment marks are placed on the substrate to be aligned and are located with reference to a second object. A lithographic apparatus may use an alignment apparatus for detecting positions of the alignment marks and for aligning the substrate using the alignment marks to ensure accurate exposure from a mask. Misalignment between the alignment marks at two different layers is measured as overlay error.

In order to monitor the lithographic process, parameters of the patterned substrate are measured. Parameters may include, for example, the overlay error between successive layers formed in or on the patterned substrate and critical linewidth of developed photosensitive resist. This measurement can be performed on a product substrate and/or on a dedicated metrology target. There are various techniques for making measurements of the microscopic structures formed in lithographic processes, including the use of scanning electron microscopes and various specialized tools. A fast and non-invasive form of a specialized inspection tool is a scatterometer in which a beam of radiation is directed onto a target on the surface of the substrate and properties of the scattered or reflected beam are measured. By comparing the properties of the beam before and after it has been reflected or scattered by the substrate, the properties of the substrate can be determined. This can be done, for example, by comparing the reflected beam with data stored in a library of known measurements associated with known substrate properties. Spectroscopic scatterometers direct a broadband radiation beam onto the substrate and measure the spectrum (intensity as a function of wavelength) of the radiation scattered into a particular narrow angular range. By contrast, angularly resolved scatterometers use a monochromatic radiation beam and measure the intensity of the scattered radiation as a function of angle.

Such optical scatterometers can be used to measure parameters, such as critical dimensions of developed photosensitive resist or overlay error (OV) between two layers formed in or on the patterned substrate. Properties of the substrate can be determined by comparing the properties of an illumination beam before and after the beam has been reflected or scattered by the substrate.

It is desirable to dictate and maintain tribological properties (e.g., friction, hardness, wear) on a surface of a substrate table. A substrate table has a surface level tolerance that can be difficult to meet because of precision requirements of lithographic and metrology processes. Wafers (e.g., semiconductor substrate), being relatively thin (e.g., <1 mm thick) compared to a width of its surface area (e.g., >100 mm), are particularly sensitive to unevenness of the substrate table. Additionally, ultra-smooth surfaces in contact may become "stuck" together, which may present a problem when a substrate must be disengaged from the substrate table.

SUMMARY

Accordingly, it is desirable to develop structures and methods for substrate tables that allow increased wear resistance and frictional properties.

In some embodiments, a method comprises treating a burled surface of an object using radiation or heat. The method further comprises setting parameters of the radiation or heat to effectuate a predetermined surface strength, hardness, roughness, coefficient of friction, chemical resistance, wear resistance, and/or corrosion of the burled surface.

In some embodiments, a support table comprises a burled surface. The burled surface comprises a contact layer configured to be treated to effectuate a predetermined surface strength, hardness, roughness, coefficient of friction, chemical resistance, wear resistance, and/or corrosion of the contact layer. The contact layer has been treated based on exposure to a beam of radiation or exposure to heat such that a parameter of the contact layer is greater than a same parameter of a reference layer having a same construction as the contact layer but without exposure to the beam of radiation or heat.

In some embodiments, a lithographic apparatus comprises an illumination system, a projection system, and a support table. The support table comprises a burled surface. The burled surface comprises a contact layer configured to be treated to effectuate a predetermined surface strength, hardness, roughness, coefficient of friction, chemical resistance, wear resistance, and/or corrosion of the contact layer. The contact layer has been treated based on exposure to a beam of radiation or exposure to heat such that a parameter of the contact layer is greater than a same parameter of a reference layer having a same construction as the contact layer but without exposure to the beam of radiation or heat. The illumination system is configured to illuminate a pattern of a patterning device. The projection system is configured to project an image of the pattern onto a substrate.

Further features of the present disclosure, as well as the structure and operation of various embodiments, are described in detail below with reference to the accompanying drawings. It is noted that the present disclosure is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present disclosure and, together with the description, further serve to explain the principles of the present disclosure and to enable a person skilled in the relevant art(s) to make and use embodiments described herein.

Figure 1A:
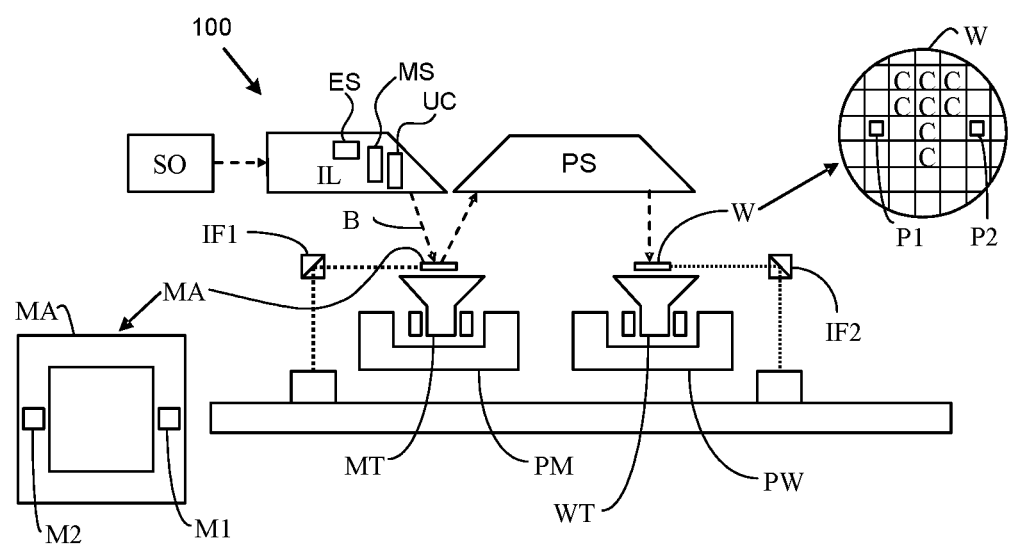
FIG. 1A shows a schematic of a reflective lithographic apparatus, according to some embodiments.

The features of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements. Additionally, generally, the left-most digit(s) of a reference number identifies the drawing in which the reference number first appears. Unless otherwise indicated, the drawings provided throughout the disclosure should not be interpreted as to-scale drawings.

DETAILED DESCRIPTION

This specification discloses one or more embodiments that incorporate the features of the present disclosure. The disclosed embodiment(s) are provided as examples. The scope of the present disclosure is not limited to the disclosed embodiment(s). Claimed features are defined by the claims appended hereto.

The embodiment(s) described, and references in the specification to "one embodiment," "an embodiment," "an example embodiment," etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Spatially relative terms, such as "beneath," "below," "lower," "above," "on," "upper" or the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "about" as used herein indicates the value of a given quantity that may vary based on a particular technology. Based on the particular technology, the term "about" may indicate a value of a given quantity that varies within, for example, 10-30% of the value (e.g., +10%, +20%, or +30% of the value).

Before describing such embodiments in more detail, however, it is instructive to present an example environment in which embodiments of the present disclosure may be implemented.

Example Lithographic Systems

Figure 1B:
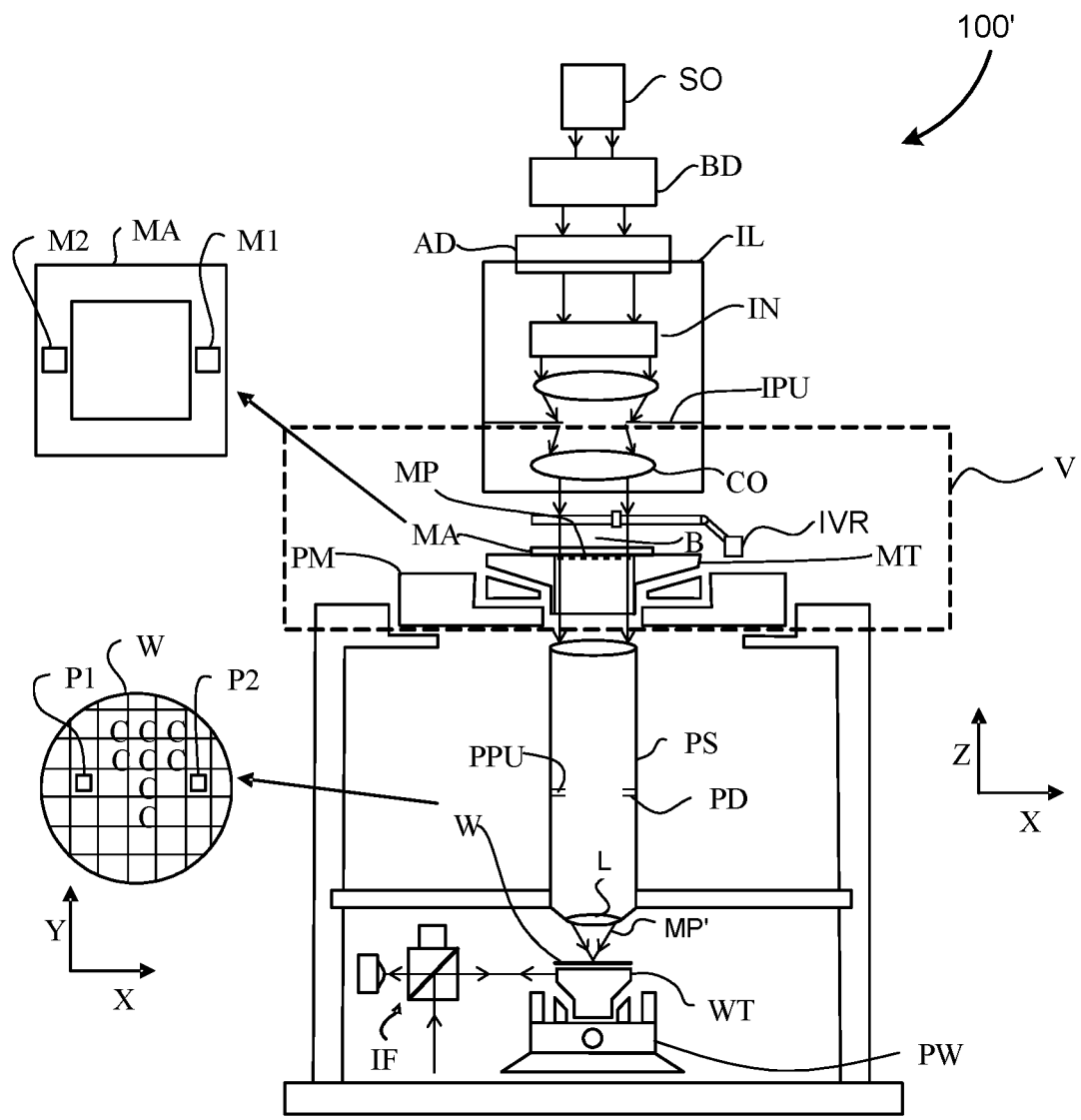
FIG. 1B shows a schematic of a transmissive lithographic apparatus, according to some embodiments.

FIGS. 1A and 1B show a lithographic apparatus 100 and a lithographic apparatus 100', respectively, in which embodiments of the present disclosure may be implemented. Lithographic apparatus 100 and lithographic apparatus 100' each include the following: an illumination system (illuminator) IL configured to condition a radiation beam B (for example, deep ultra violet or extreme ultra violet radiation); a support structure (for example, a mask table) MT configured to support a patterning device (for example, a mask, a reticle, or a dynamic patterning device) MA and connected to a first positioner PM configured to accurately position the patterning device MA; and, a substrate table (for example, a wafer table) WT configured to hold a substrate (for example, a resist coated wafer) W and connected to a second positioner PW configured to accurately position the substrate W. Lithographic apparatus 100 and 100' also have a projection system PS configured to project a pattern imparted to the radiation beam B by patterning device MA onto a target portion (for example, comprising one or more dies) C of the substrate W. In lithographic apparatus 100, the patterning device MA and the projection system PS are reflective. In lithographic apparatus 100', the patterning device MA and the projection system PS are transmissive.

The illumination system IL may include various types of optical components, such as refractive, reflective, catadioptric, magnetic, electromagnetic, electrostatic, or other types of optical components, or any combination thereof, for directing, shaping, or controlling the radiation beam B.

The support structure MT holds the patterning device MA in a manner that depends on the orientation of the patterning device MA with respect to a reference frame, the design of at least one of the lithographic apparatus 100 and 100', and other conditions, such as whether or not the patterning device MA is held in a vacuum environment. The support structure MT may use mechanical, vacuum, electrostatic, or other clamping techniques to hold the patterning device MA. The support structure MT may be a frame or a table, for example, which may be fixed or movable, as required. By using sensors, the support structure MT may ensure that the patterning device MA is at a desired position, for example, with respect to the projection system PS.

The term "patterning device" MA should be broadly interpreted as referring to any device that may be used to impart a radiation beam B with a pattern in its cross-section, such as to create a pattern in the target portion C of the substrate W. The pattern imparted to the radiation beam B may correspond to a particular functional layer in a device being created in the target portion C to form an integrated circuit.

The patterning device MA may be transmissive (as in lithographic apparatus 100' of FIG. 1B) or reflective (as in lithographic apparatus 100 of FIG. 1A). Examples of patterning devices MA include reticles, masks, programmable mirror arrays, or programmable LCD panels. Masks are well known in lithography, and include mask types such as binary, alternating phase shift, or attenuated phase shift, as well as various hybrid mask types. An example of a programmable mirror array employs a matrix arrangement of small mirrors, each of which may be individually tilted so as to reflect an incoming radiation beam in different directions. The tilted mirrors impart a pattern in the radiation beam B, which is reflected by a matrix of small mirrors.

The term "projection system" PS may encompass any type of projection system, including refractive, reflective, catadioptric, magnetic, electromagnetic and electrostatic optical systems, or any combination thereof, as appropriate for the exposure radiation being used, or for other factors, such as the use of an immersion liquid on the substrate W or the use of a vacuum. A vacuum environment may be used for EUV or electron beam radiation since other gases may absorb too much radiation or electrons. A vacuum environment may therefore be provided to the whole beam path with the aid of a vacuum wall and vacuum pumps.

Lithographic apparatus 100 and/or lithographic apparatus 100' may be of a type having two (dual stage) or more substrate tables WT (and/or two or more mask tables). In such "multiple stage" machines, the additional substrate tables WT may be used in parallel, or preparatory steps may be carried out on one or more tables while one or more other substrate tables WT are being used for exposure. In some situations, the additional table may not be a substrate table WT.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIGS. 1A and 1B, the illuminator IL receives a radiation beam from a radiation source SO. The source SO and the lithographic apparatus 100, 100' may be separate physical entities, for example, when the source SO is an excimer laser. In such cases, the source SO is not considered to form part of the lithographic apparatus 100 or 100', and the radiation beam B passes from the source SO to the illuminator IL with the aid of a beam delivery system BD (in FIG. 1B) including, for example, suitable directing mirrors and/or a beam expander. In other cases, the source SO may be an integral part of the lithographic apparatus 100, 100', for example, when the source SO is a mercury lamp. The source SO and the illuminator IL, together with the beam delivery system BD, if required, may be referred to as a radiation system.

The illuminator IL may include an adjuster AD (in FIG. 1B) for adjusting the angular intensity distribution of the radiation beam. Generally, at least the outer and/or inner radial extent (commonly referred to as "σ-outer" and "σ-inner," respectively) of the intensity distribution in a pupil plane of the illuminator may be adjusted. In addition, the illuminator IL may comprise various other components (in FIG. 1B), such as an integrator IN and a condenser CO. The illuminator IL may be used to condition the radiation beam B to have a desired uniformity and intensity distribution in its cross section.

Referring to FIG. 1A, the radiation beam B is incident on the patterning device (for example, mask) MA, which is held on the support structure (for example, mask table) MT, and is patterned by the patterning device MA. In lithographic apparatus 100, the radiation beam B is reflected from the patterning device (for example, mask) MA. After being reflected from the patterning device (for example, mask) MA, the radiation beam B passes through the projection system PS, which focuses the radiation beam B onto a target portion C of the substrate W. With the aid of the second positioner PW and position sensor IF2 (for example, an interferometric device, linear encoder, or capacitive sensor), the substrate table WT may be moved accurately (for example, so as to position different target portions C in the path of the radiation beam B). Similarly, the first positioner PM and another position sensor IF1 may be used to accurately position the patterning device (for example, mask) MA with respect to the path of the radiation beam B. Patterning device (for example, mask) MA and substrate W may be aligned using mask alignment marks M1, M2 and substrate alignment marks P1, P2.

Referring to FIG. 1B, the radiation beam B is incident on the patterning device (for example, mask MA), which is held on the support structure (for example, mask table MT), and is patterned by the patterning device. Having traversed the mask MA, the radiation beam B passes through the projection system PS, which focuses the beam onto a target portion C of the substrate W. The projection system has a pupil conjugate PPU to an illumination system pupil IPU. Portions of radiation emanate from the intensity distribution at the illumination system pupil IPU and traverse a mask pattern without being affected by diffraction at the mask pattern and create an image of the intensity distribution at the illumination system pupil IPU.

The projection system PS projects an image MP' of the mask pattern MP, where image MP' is formed by diffracted beams produced from the mark pattern MP by radiation from the intensity distribution, onto a photoresist layer coated on the substrate W. For example, the mask pattern MP may include an array of lines and spaces. A diffraction of radiation at the array and different from zeroth order diffraction generates diverted diffracted beams with a change of direction in a direction perpendicular to the lines. Undiffracted beams (i.e., so-called zeroth order diffracted beams) traverse the pattern without any change in propagation direction. The zeroth order diffracted beams traverse an upper lens or upper lens group of the projection system PS, upstream of the pupil conjugate PPU of the projection system PS, to reach the pupil conjugate PPU. The portion of the intensity distribution in the plane of the pupil conjugate PPU and associated with the zeroth order diffracted beams is an image of the intensity distribution in the illumination system pupil IPU of the illumination system IL. The aperture device PD, for example, is disposed at or substantially at a plane that includes the pupil conjugate PPU of the projection system PS.

The projection system PS is arranged to capture, by means of a lens or lens group L, not only the zeroth order diffracted beams, but also first-order or first- and higher-order diffracted beams (not shown). In some embodiments, dipole illumination for imaging line patterns extending in a direction perpendicular to a line may be used to utilize the resolution enhancement effect of dipole illumination. For example, first-order diffracted beams interfere with corresponding zeroth-order diffracted beams at the level of the wafer W to create an image of the line pattern MP at highest possible resolution and process window (i.e., usable depth of focus in combination with tolerable exposure dose deviations). In some embodiments, astigmatism aberration may be reduced by providing radiation poles (not shown) in opposite quadrants of the illumination system pupil IPU. Further, in some embodiments, astigmatism aberration may be reduced by blocking the zeroth order beams in the pupil conjugate PPU of the projection system associated with radiation poles in opposite quadrants. This is described in more detail in U.S. Pat. No. 7,511,799 B2, issued Mar. 31, 2009, which is incorporated by reference herein in its entirety.

With the aid of the second positioner PW and position sensor IF (for example, an interferometric device, linear encoder, or capacitive sensor), the substrate table WT may be moved accurately (for example, so as to position different target portions C in the path of the radiation beam B). Similarly, the first positioner PM and another position sensor (not shown in FIG. 1B) may be used to accurately position the mask MA with respect to the path of the radiation beam B (for example, after mechanical retrieval from a mask library or during a scan).

In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner), the mask table MT may be connected to a short-stroke actuator only or may be fixed. Mask MA and substrate W may be aligned using mask alignment marks M1, M2, and substrate alignment marks P1, P2. Although the substrate alignment marks (as illustrated) occupy dedicated target portions, they may be located in spaces between target portions (known as scribe-lane alignment marks). Similarly, in situations in which more than one die is provided on the mask MA, the mask alignment marks may be located between the dies.

Mask table MT and patterning device MA may be in a vacuum chamber V, where an in-vacuum robot IVR may be used to move patterning devices such as a mask in and out of vacuum chamber. Alternatively, when mask table MT and patterning device MA are outside of the vacuum chamber, an out-of-vacuum robot may be used for various transportation operations, similar to the in-vacuum robot IVR. Both the in-vacuum and out-of-vacuum robots should be calibrated for a smooth transfer of any payload (e.g., mask) to a fixed kinematic mount of a transfer station.

The lithographic apparatus 100 and 100' may be used in at least one of the following modes:

1. In step mode, the support structure (for example, mask table) MT and the substrate table WT are kept essentially stationary, while an entire pattern imparted to the radiation beam B is projected onto a target portion C at one time (i.e., a single static exposure). The substrate table WT is then shifted in the X and/or Y direction so that a different target portion C may be exposed.

2. In scan mode, the support structure (for example, mask table) MT and the substrate table WT are scanned synchronously while a pattern imparted to the radiation beam B is projected onto a target portion C (i.e., a single dynamic exposure). The velocity and direction of the substrate table WT relative to the support structure (for example, mask table) MT may be determined by the (de-)magnification and image reversal characteristics of the projection system PS.

3. In another mode, the support structure (for example, mask table) MT is kept substantially stationary holding a programmable patterning device, and the substrate table WT is moved or scanned while a pattern imparted to the radiation beam B is projected onto a target portion C. A pulsed radiation source SO may be employed and the programmable patterning device is updated as required after each movement of the substrate table WT or in between successive radiation pulses during a scan. This mode of operation may be readily applied to maskless lithography that utilizes a programmable patterning device, such as a programmable mirror array.

Combinations and/or variations on the described modes of use or entirely different modes of use may also be employed.

In a further embodiment, lithographic apparatus 100 includes an extreme ultraviolet (EUV) source, which is configured to generate a beam of EUV radiation for EUV lithography. In general, the EUV source is configured in a radiation system, and a corresponding illumination system is configured to condition the EUV radiation beam of the EUV source.

Figure 2:
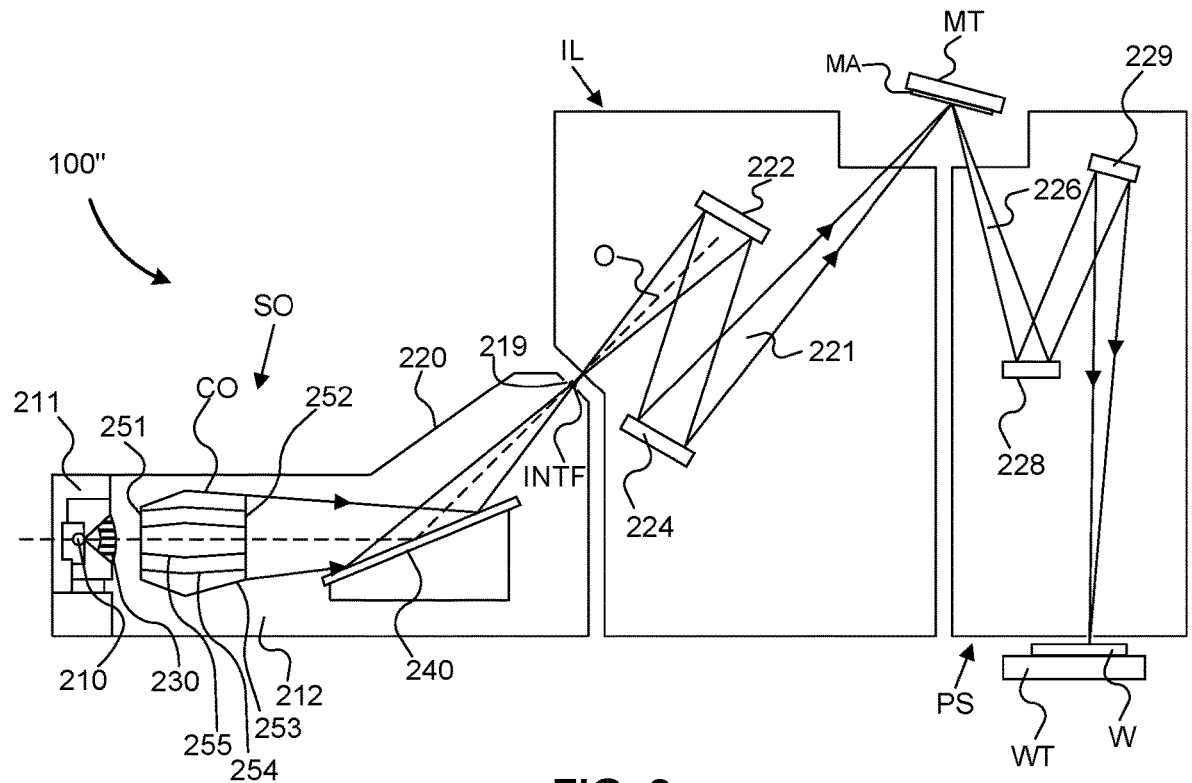
FIG. 2 shows a more detailed schematic of the reflective lithographic apparatus, according to some embodiments.

FIG. 2 shows the lithographic apparatus 100 in more detail, including the source collector apparatus SO, the illumination system IL, and the projection system PS. The source collector apparatus SO is constructed and arranged such that a vacuum environment may be maintained in an enclosing structure 220 of the source collector apparatus SO. An EUV radiation emitting plasma 210 may be formed by a discharge produced plasma source. EUV radiation may be produced by a gas or vapor, for example Xe gas, Li vapor, or Sn vapor in which the very hot plasma 210 is created to emit radiation in the EUV range of the electromagnetic spectrum. The very hot plasma 210 is created by, for example, an electrical discharge causing at least a partially ionized plasma. Partial pressures of, for example, 10 Pa of Xe, Li, Sn vapor, or any other suitable gas or vapor may be used for efficient generation of the radiation. In some embodiments, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap), which is positioned in or behind an opening in source chamber 211. The contaminant trap 230 may include a channel structure. Contamination trap 230 may also include a gas barrier or a combination of a gas barrier and a channel structure. The contaminant trap 230 (or contaminant barrier) further indicated herein at least includes a channel structure.

The collector chamber 212 may include a radiation collector CO, which may be a so-called grazing incidence collector. Radiation collector CO has an upstream radiation collector side 251 and a downstream radiation collector side 252. Radiation that traverses collector CO may be reflected off a grating spectral filter 240 to be focused in a virtual source point IF. The virtual source point INTF is commonly referred to as the intermediate focus, and the source collector apparatus is arranged such that the intermediate focus INTF is located at or near an opening 219 in the enclosing structure 220. The virtual source point INTF is an image of the radiation emitting plasma 210. Grating spectral filter 240 is used in particular for suppressing infra-red (IR) radiation.

Subsequently the radiation traverses the illumination system IL, which may include a faceted field mirror device 222 and a faceted pupil mirror device 224 arranged to provide a desired angular distribution of beam of radiation 221, at the patterning device MA, as well as a desired uniformity of radiation intensity at the patterning device MA. Upon reflection of the beam of radiation 221 at the patterning device MA, held by the support structure MT, a patterned beam 226 is formed and the patterned beam 226 is imaged by the projection system PS via reflective elements 228, 229 onto a substrate W held by the wafer stage or substrate table WT.

More elements than shown may generally be present in illumination optics unit IL and projection system PS. The grating spectral filter 240 may optionally be present, depending upon the type of lithographic apparatus. Further, there may be more mirrors present than those shown in the FIG. 2, for example there may be one to six additional reflective elements present in the projection system PS than shown in FIG. 2.

Collector optic CO, as illustrated in FIG. 2, is depicted as a nested collector with grazing incidence reflectors 253, 254, and 255, just as an example of a collector (or collector mirror). The grazing incidence reflectors 253, 254, and 255 are disposed axially symmetric around an optical axis O and a collector optic CO of this type is preferably used in combination with a discharge produced plasma source, often called a DPP source.

Exemplary Lithographic Cell

Figure 3:
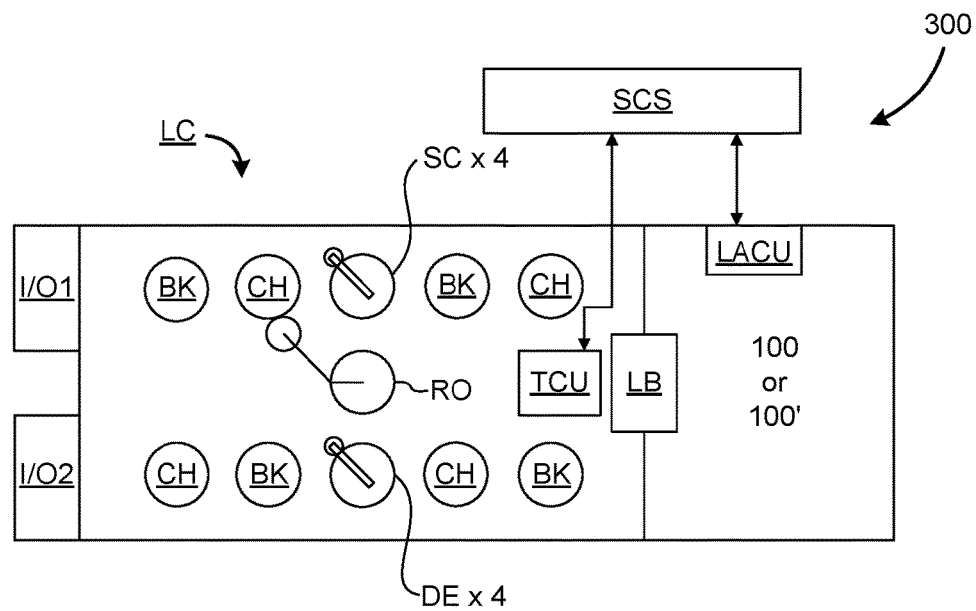
FIG. 3 shows a schematic of a lithographic cell, according to some embodiments.

FIG. 3 shows a lithographic cell 300, also sometimes referred to a lithocell or cluster, according to some embodiments. Lithographic apparatus 100 or 100' may form part of lithographic cell 300. Lithographic cell 300 may also include one or more apparatuses to perform pre- and post-exposure processes on a substrate. Conventionally these include spin coaters SC to deposit resist layers, developers DE to develop exposed resist, chill plates CH, and bake plates BK. A substrate handler, or robot, RO picks up substrates from input/output ports I/O1. I/O2, moves them between the different process apparatuses and delivers them to the loading bay LB of the lithographic apparatus 100 or 100'. These devices, which are often collectively referred to as the track, are under the control of a track control unit TCU, which is itself controlled by a supervisory control system SCS, which also controls the lithographic apparatus via lithography control unit LACU. Thus, the different apparatuses may be operated to maximize throughput and processing efficiency.

Embodiments of the disclosure may be implemented in hardware, firmware, software, or any combination thereof. Embodiments of the disclosure may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, and/or instructions may be described herein as performing certain actions. However, it should be appreciated that such descriptions are merely for convenience and that such actions in fact result from computing devices, processors, controllers, or other devices executing the firmware, software, routines, instructions, etc.

Exemplary Substrate Table

Figure 4:
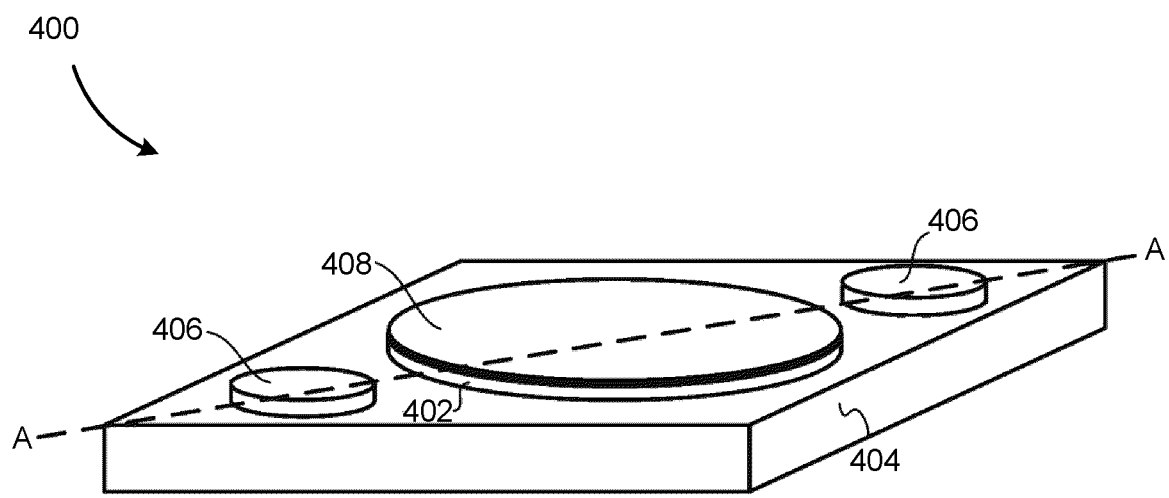
FIG. 4 shows a schematic of a substrate stage, according to some embodiments.

FIG. 4 shows a schematic of a substrate stage 400, according to some embodiments. In some embodiments, substrate stage comprises a substrate table 402, a support block 404, and one or more sensor structures 406. In some embodiments, substrate table 402 comprises a clamp to hold a substrate 408 (e.g., an electrostatic clamp). In some embodiments, each of one or more sensor structures 406 comprises a transmission image sensor (TIS) plate. The TIS plate is a sensor unit that comprises one or more sensors and/or markers for use in a TIS sensing system used for accurate positioning of the wafer relative to the position of a projection system (e.g., projection system PS, FIG. 1) and a mask (e.g., mask MA, FIG. 1) of a lithographic apparatus (e.g., lithographic apparatus 100, FIG. 1). While TIS plates are shown here for illustration, embodiments herein are not limited to any particular sensor. Substrate table 402 is disposed on support block 404. One or more sensor structures 406 are disposed on support block 404.

In some embodiments, substrate 408 is disposed on substrate table 402 when substrate stage 400 supports substrate 408.

The terms "flat," "flatness" or the like may be used herein to describe structures in relation to a general plane of a surface. For example, a bent or unleveled surface may be one that does not conform to a flat plane. Protrusions and/or recesses on a surface may also be characterized as deviations from a 'flat' plane.

Figure 5:
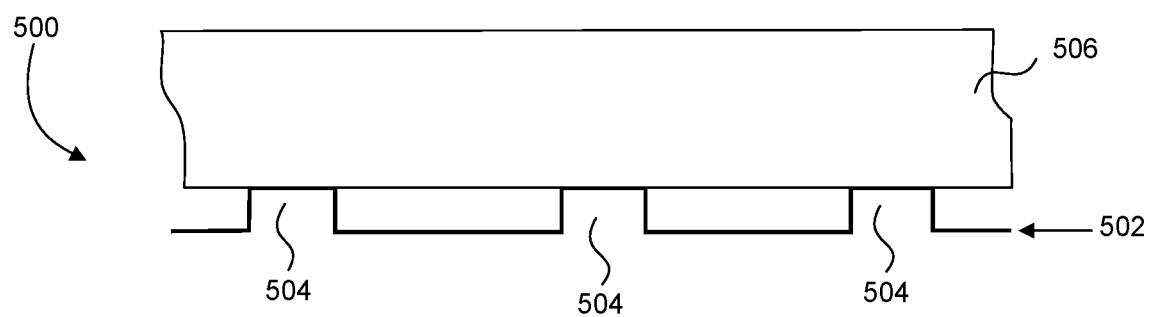
FIG. 5 shows a cross-sectional schematic of a region of a substrate table, according to some embodiments.

In some embodiments, the surface of the substrate tables mentioned above (e.g., wafer table WT in FIGS. 1A and 1B, substrate table 402 in FIG. 4) may be flat or burled (e.g., as shown in FIG. 5). When the surface of a substrate table is flat, any particulates or contaminants stuck between the substrate table and a wafer will cause the contaminant to print through the wafer, causing lithography errors in its vicinity. Consequently, contaminants reduce device yield rates and increase production costs.

Disposing burls on substrate tables help to reduce the undesirable effects of a flat substrate table. When a wafer is clamped to a burled substrate table, empty spaces are available in the regions where the wafer does not contact the substrate table. The empty spaces function as pockets for contaminants so as to prevent printing errors. Another feature is that contaminants that make it on the burls are more likely to become disintegrated due to the increased load caused by the burls (e.g., increased local pressure or force per unit area). Crushing contaminants helps mitigate print-through errors as well. In some embodiments, the combined surface area of the burls may be approximately 1-5% of the surface area of the substrate table. Here, surface area of the burls refers to the surfaces of the burls that come into contact with the wafer (e.g., not including the side walls of the burls). And surface area of the substrate table refers to the span of surface of the substrate table where the burls reside (e.g., not including the lateral or back side of the substrate table). When the wafer is clamped onto the burled substrate table, the load is increased by, e.g., 100 fold as compared to a flat substrate table, which is enough to disintegrate most contaminants. Though the example here uses a substrate table, the example is not intended to be limiting. For example, embodiments of the present disclosure may be implemented on reticle tables, for a variety of clamping structures (e.g., electrostatic clamps, clamping membranes), and in a variety of lithographic systems (e.g., EUV, DUV).

FIG. 5 shows a cross-sectional schematic of a region of a substrate table 500, according to some embodiments. Substrate table 500 comprises a burled surface 502 comprising burls 504. Burled surface 502 can be a surface of an electrostatic clamp that is disposed on substrate table 500. When substrate table 500 supports a substrate 506, burls 504 can contact substrate 506.

In some embodiments, each of burls 504 has a width or diameter of approximately 100-1000 microns (dimension parallel to the plane of burled surface 502). Each of burls 504 has a height of approximately 10-200, 10-150, or 10-100 microns (dimension perpendicular to plane of burled surface 502). Other dimensions for burls 504 may be used on the basis of conditional considerations. For example, dimensions for burls 504 may be based on sizes of typical or expected contaminant particulates in a lithographic apparatus. In another example, contact surface area is a parameter that influences friction. Therefore, dimensions for burls 504 may be based on a contact area to arrive at a designated friction.

The burl-to-wafer interface governs the functional performance of the substrate table. For example, when the surface of a substrate table is smooth, an adhesion force may develop between the smooth surface of the substrate table and the smooth surface of a wafer—a phenomenon known as wringing. A method to mitigate issues is to make a contact surface burled and/or rough. However, rough burl-tops do not retain their roughness through repeated use. The rougher the initial roughness of the burl-top, the faster it may polish and wear away. Another method to reduce friction at the burl-to-wafer interface is to coat the burl using a low-friction coating. However, in the presence of water (e.g., immersion lithography) the coating may polish away rather quickly.

Moreover, it has been observed that burled surfaces of substrate tables are susceptible to unusually rapid wear, particularly at the edges away from the center of the substrate table (i.e., uneven wear). Uneven wear causes a wafer to bend when clamped to the substrate table, which in turn reduces accuracy of lithographic placement of device structures, overlay drift over time, and the like. Overall wear may lead to a decrease in imaging performance due to change in global shape of the clamping surface.

A conventional substrate table used in lithographic processes is typically sent back to the manufacturer for refurbishment or replaced with a new one. Both alternatives can be costly. Moreover, refurbishment can be a slow process, with many variations to processing depending on wear features (i.e., non-standard refurbishment processes), and often lasting weeks or months before the final product can be returned to the customer.

Exemplary Substrate Table Manufacture Method

A method to address issues associated with refurbishment of contact surfaces (e.g., a burled surface for use in lithographic processes), it is possible to extend the lifetime of the surfaces by manipulating properties of the surface material during the manufacture process. For example, during manufacturing, processes may be applied to the contact surface to harden the surface material. The hardened contact surface may be more resistant to wear. Hardness and wear resistance are non-limiting examples of properties of the contact surface. Other non-limiting examples of properties of a contact surface may include surface strength, roughness, coefficient of friction, chemical resistance, corrosion, or the like. Moreover, the processes are not limited to newly manufactured surfaces. A used contact surface that is returned for refurbishment may also use the processes disclosed herein to reapply a more durable, long-lasting surface on a previously used product.

Figure 6:
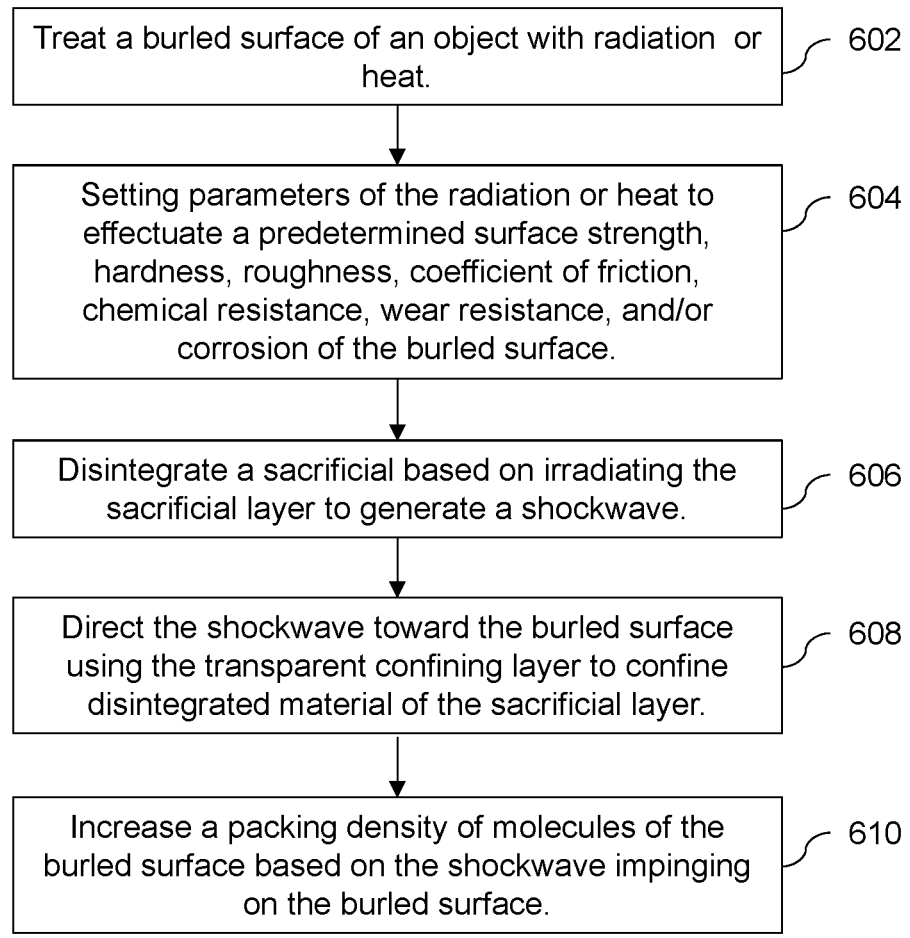
FIG. 6 shows method steps for manipulating a property of a contact surface, according to some embodiments.

FIG. 6 shows method steps for manipulating a property of a contact surface, according to some embodiments. At step 602, a burled surface of an object (e.g., a substrate table, a clamp, or the like) is treated with radiation or heat. At step 604, parameters of the radiation or heat are set so as to effectuate a predetermined surface strength, hardness, roughness, coefficient of friction, chemical resistance, wear resistance, and/or corrosion of the burled surface.

Figure 7A:
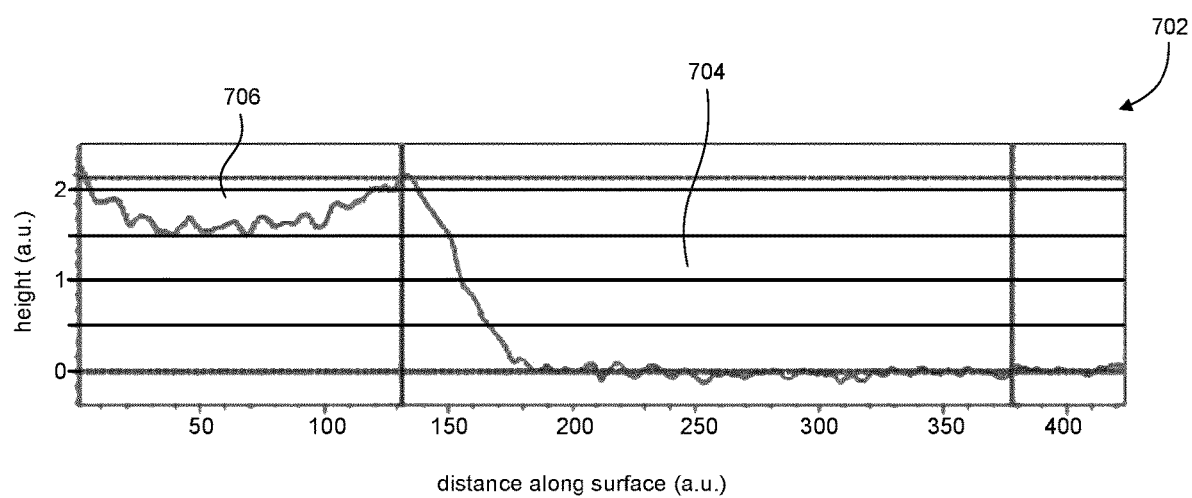
FIGS. 7A and 7B show graphs that represent surface topography measurements of a contact surfaces, according to some embodiments.

FIG. 7A shows a graph 702 that represents a surface topography measurement of a contact surface (e.g., a burl-top surface of an electrostatic clamp), according to some embodiments. The data in graph 702 corresponds to a portion of a contact surface that has been treated with a laser as described in the method of FIG. 6. The vertical axis of graph 702 represents a topographical height or depth (in non-limiting arbitrary units a.u.) with respect to the plane of the contact surface. The horizontal axis represents a distance in a direction perpendicular to the topographical height (i.e., along the surface of the contact surface) (in arbitrary units a.u.). Furthermore, material in region 704 has been removed (e.g., using a polishing process)), whereas the region 706 has been spared from the polishing process.

In some embodiments, the data in graph 702 shows that the polishing process created a recess on the contact surface having a depth of approximately 2 a.u. The depth of removed-material is correlated to properties of the contact surface material (e.g., hardness). As described earlier, the properties of the contact surface material may be adjusted based on the laser or heat treatment described with respect to FIG. 6. For example, the laser may introduce local heat to the contact surface and induce annealing effects in the material of the contact surface. In this manner, regions of the contact surface may be targeted for treatment, as opposed to, for example, heating the entire object in an oven. It may be undesirable to heat certain parts of the object, particularly if the object is an assembly of adhered components having unequal coefficients of thermal expansion.

Figure 7B:
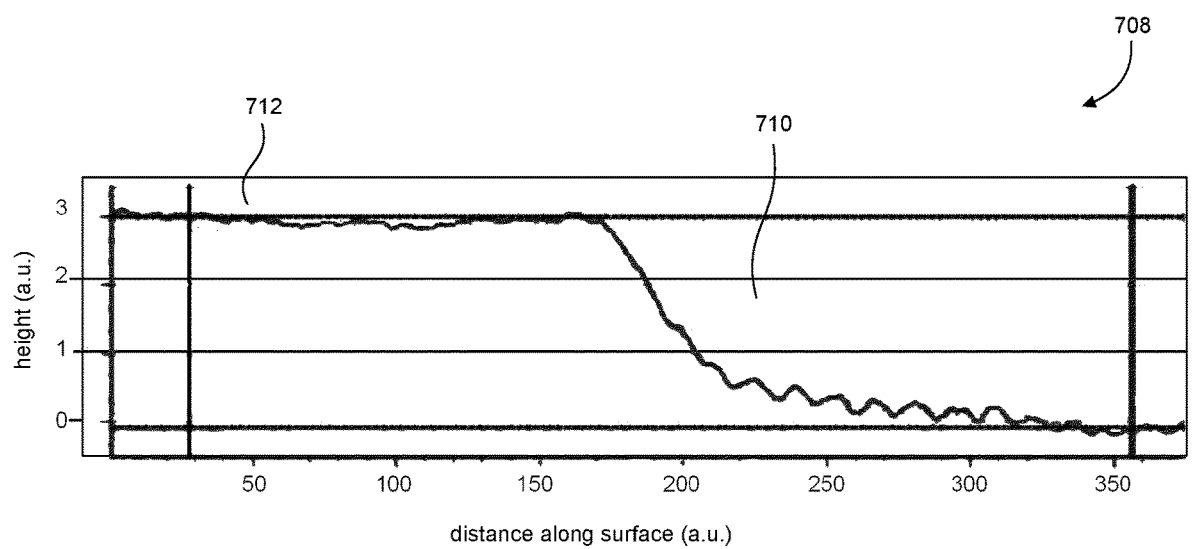

For comparison, FIG. 7B shows a graph 708 that represents a surface topography measurement of a contact surface (e.g., a burl-top surface of an electrostatic clamp), according to some embodiments. The axes of graph 708 are the same as the axes in graph 702. The data in graph 708 corresponds to a portion of the contact surface that has not been treated with a laser. The contact surface shown in FIG. 7B does have a region 710 that has been exposed to the same polishing process described in reference to FIG. 7A and a region 712 that was spared from the polishing process.

In some embodiments, the data in graph 708 shows that the polishing process created a recess on the contact surface having a depth of approximately 3 a.u. The laser treatment was able to reduce or mitigate the amount of material removed by the polishing process by about 33%. Therefore, the laser treatment has the effect of changing the material properties of the contact surface such that material is more difficult to remove, i.e., wear resistance is improved. Referring briefly to FIG. 6, the parameters of radiation or heat at step 604 may correspond to the desired outcome for the material properties of the contact surface. Parameters of the radiation or heat can include, for example, exposure time, pulsing, pulse length, amplitude, magnitude, repetition rate, wavelength, focus spot size, focus spot shape, pulse energy, pulse peak power, average power, pulse-to-pulse time, scan speed, scan pitch, scanning pattern, and/or the like.

Figure 8:
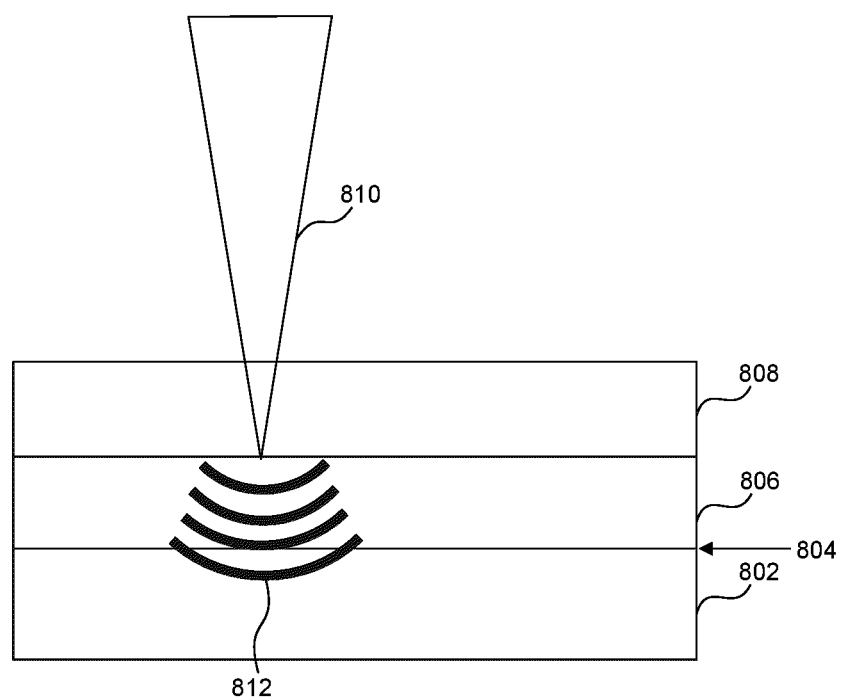
FIG. 8 shows laser processing of an object, according to some embodiments.

FIG. 8 shows laser processing of an object, according to some embodiments. In some embodiments, the structure may be a burled surface having a contact layer 802. Contact layer 802 may have a contact surface 804. In some embodiments, the burled surface may be coated with a sacrificial layer 806 and a transparent confining layer 808. Sacrificial layer 806 may be disposed on the burled surface (e.g., on contact surface 804). Transparent confining layer 808 may be disposed on sacrificial layer 806.

In some embodiments, the method of FIG. 6 may be applied to the burled surface shown in FIG. 8. For example, a beam of radiation 810 (e.g., a laser) is directed toward the burled surface, such that beam of radiation is incident on transparent confining layer 808. In the context of transparent confining layer 808, the term "transparent" or its like may refer to transparency or partial transparency with respect to wavelength(s) of beam of radiation 810. That is, at least a portion of the energy of beam of radiation 810 may be transmitted through transparent confining layer 808 such that the radiation is able to interact with sacrificial layer 806.

In some embodiments, sacrificial layer 806 comprises a material that absorbs wavelength(s) of beam of radiation 810. The material of sacrificial layer 806 may rapidly expand (e.g., ablated, disintegrated, evaporated, or the like) when it interacts with beam of radiation 810 so as to generate a shockwave 812. For example, the material of sacrificial layer 806 may comprise black-colored adhesive tape. Shockwave 812 may impact and compress contact layer 802. The compression may change material properties of contact layer 802 (e.g., atomic packing density, surface strength, hardness, roughness, coefficient of friction, chemical resistance, wear resistance, and/or corrosion). In this manner, properties of the burled surface may be manipulated. The laser/shockwave process described above may be referred to as laser peening.

In some embodiments, the absence of transparent confining layer 808 may cause shockwave 812 to expand away from contact layer 802 rather than toward contact layer 802—i.e., shockwave energy is wasted. Therefore, transparent confining layer 808 functions to confine the expanding material of sacrificial layer 806 so as to direct shockwave 812 toward contact surface 804.

Referring again to FIG. 6, in some embodiments, the burled surface can comprise structures as described in reference to FIG. 8. Then, step 602 (the step of treating with radiation or heat) may comprise transmitting the radiation through a transparent confining layer to irradiate a sacrificial layer. At step 606, the sacrificial layer is disintegrated based on the irradiating so as to generate a shockwave. At step 608, the shockwave is directed toward the burled surface using the transparent confining layer so as to confine the disintegrated material of the sacrificial layer. At step 610, a packing density of molecules of the burled surface is increased based on the shockwave impinging on the burled surface.

In some embodiments, step 604 of setting (or selecting) parameters of the radiation or heat can comprise setting parameters of the radiation or heat based on the material of the sacrificial layer and/or contact layer 802 (e.g., titanium (e.g., TiN), chromium (e.g., CrN), diamond-like carbon, and/or the like). For example, the generated shockwave may be sensitive to how the material of the sacrificial layer reacts to exposure time, pulsing, pulse length, amplitude, magnitude, repetition rate, wavelength, and/or the like. It is desirable to control the pressure of the shockwave such that properties of the burled surface can be manipulated without damaging the burled surface.

Earlier embodiments referring to FIG. 6 referred to having the radiation or heat being directly applied to the burled surface (i.e., no sacrificial layer or confining layer). In some embodiments, the treating with radiation or heat may comprise interacting the radiation or heat directly with the burled surface without first passing the radiation or heat through another material.

The method steps of FIG. 6 may be performed in any conceivable order and it is not required that all steps be performed. Moreover, the method steps of FIG. 6 described above merely reflect an example of steps and are not limiting. That is, further method steps and functions may be envisaged based upon any of the embodiments described herein.

In some embodiments, when comparing a treated contact layer to an untreated one, the untreated one may be called a reference layer. The reference layer and the treated contact layer may be of identical or substantially similar construction prior to the treatment of the contact layer. In this manner, a performance parameter of the treated contact layer can be quantified in comparison to the reference layer. An example of such a comparison can be, for example, as in FIGS. 7A and 7B. FIG. 7A may correspond to a treated contact layer, whereas FIG. 7B may correspond to a reference layer.

In some embodiments, a support table (see e.g., mask table MT or substrate table WT of FIG. 1) for may comprise a burled surface comprising a contact layer. The support table can be part of a lithographic apparatus (e.g., lithographic apparatuses 100 or 100'). The contact layer may be treated to effectuate a predetermined surface strength, hardness, roughness, coefficient of friction, chemical resistance, wear resistance, and/or corrosion of the contact layer. The contact layer, having been treated based on exposure to a beam of radiation or exposure to heat, has a parameter (e.g., hardness) that is greater than a same parameter (e.g., hardness if the previously referred parameter was hardness) of a reference layer having a same construction as the contact layer but without exposure to the beam of radiation or heat. The burled surface can be part of an electrostatic clamp that is part of the support table.

The embodiments may further be described using the following clauses:

1. A method comprising:
    treating a burled surface of an object using radiation or heat; and
    setting parameters of the radiation or heat to effectuate a predetermined surface strength, hardness, roughness, coefficient of friction, chemical resistance, wear resistance, and/or corrosion of the burled surface.

2. The method of clause 1, wherein:
   the burled surface comprises a sacrificial layer disposed on the burled surface and a transparent confining layer disposed on the sacrificial layer; and
   the transparent confining layer is at least partially transparent to the radiation.
3. The method of clause 2, wherein the treating comprises transmitting the radiation through the transparent confining layer to irradiate the sacrificial layer and the method further comprises:
   disintegrating the sacrificial based on the irradiating the sacrificial layer to generate a shockwave; and
   directing the shockwave toward the burled surface using the transparent confining layer to confine disintegrated material of the sacrificial layer.
4. The method of clause 3, further comprising increasing a packing density of molecules of the burled surface based on the directing the shockwave.
5. The method of clause 1, wherein the treating comprises interacting the radiation or heat directly with the burled surface without first passing the radiation or heat through another material.
6. The method of clause 1, wherein the parameters of the radiation or heat are selected based on the burled surface comprising titanium, chromium, and/or diamond-like carbon.
7. The method of clause 1, wherein the setting parameters of the radiation or heat comprise exposure time, pulsing, pulse length, amplitude, magnitude, repetition rate, wavelength, focus spot size, focus spot shape, pulse energy, pulse peak power, average power, pulse-to-pulse time, scan speed, scan pitch, and/or scanning pattern.
8. The method of clause 1, wherein the treating comprises treating the burled surface using a laser.
9. The method of clause 1, further comprising using an electrostatic clamp, a support table, or the electrostatic clamp and the support table as the object.
10. A support table comprising:
    a burled surface comprising a contact layer configured to be treated to effectuate a predetermined surface strength, hardness, roughness, coefficient of friction, chemical resistance, wear resistance, and/or corrosion of the contact layer;
    wherein the contact layer has been treated based on exposure to a beam of radiation or exposure to heat such that a parameter of the contact layer is greater than a same parameter of a reference layer having a same construction as the contact layer but without exposure to the beam of radiation or heat.
11. The support table of clause 10, further comprising an electrostatic clamp comprising the burled surface.
12. The support table of clause 10, wherein the parameter of the contact layer comprises hardness and/or wear-resistance.
13. The support table of clause 10, wherein the contact layer comprises titanium, chromium, and/or diamond-like carbon.
14. The support table of clause 10, wherein:
    a sacrificial layer is disposed on the contact layer;
    the burled surface further comprises a transparent confining layer disposed on the sacrificial layer; and
    the transparent confining layer is at least partially transparent to the beam.
15. The support table of clause 14, wherein the contact layer has been treated based on transmission of radiation through the transparent confining layer to irradiate the sacrificial layer, disintegrating the sacrificial based on the irradiating the sacrificial layer to generate a shockwave, and directing the shockwave toward the burled surface using the transparent confining layer to confine disintegrated material of the sacrificial layer.
16. A lithographic apparatus comprising:
    an illumination system configured to illuminate a pattern of a patterning device;
    a projection system configured to project an image of the pattern onto a substrate; and
    a support table comprising:
        a burled surface comprising a contact layer configured to be treated to effectuate a predetermined surface strength, hardness, roughness, coefficient of friction, chemical resistance, wear resistance, and/or corrosion of the contact layer;
        wherein the contact layer has been treated based on exposure to a beam of radiation or exposure to heat such that a parameter of the contact layer is greater than a same parameter of a reference layer having a same construction as the contact layer but without exposure to the beam of radiation or heat.
17. The lithographic apparatus of clause 16, further comprising an electrostatic clamp comprising the burled surface.
18. The lithographic apparatus of clause 16, wherein the parameter of the contact layer comprises hardness and/or wear-resistance.
19. The lithographic apparatus of clause 16, wherein the contact layer comprises titanium, chromium, and/or diamond-like carbon.
20. The lithographic apparatus of clause 16, wherein the support table is configured to support the substrate.
21. The lithographic apparatus of clause 16, wherein the support table is configured to support the patterning device.
22. The lithographic apparatus of clause 16, wherein:
    a sacrificial layer is disposed on the contact layer;
    the burled surface further comprises a transparent confining layer disposed on the sacrificial layer; and
    the transparent confining layer is at least partially transparent to the beam.
23. The lithographic apparatus of clause 22, wherein the contact layer has been treated based on transmission of radiation through the transparent confining layer to irradiate the sacrificial layer, disintegrating the sacrificial based on the irradiating the sacrificial layer to generate a shockwave, and directing the shockwave toward the burled surface using the transparent confining layer to confine disintegrated material of the sacrificial layer.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, LCDs, thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track unit (a tool that typically applies a layer of resist to a substrate and develops the exposed resist), a metrology unit and/or an inspection unit. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of disclosed embodiments in the context of optical lithography, it will be appreciated that the disclosed embodiments may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

It is to be understood that the phraseology or terminology herein is for the purpose of description and not of limitation, such that the terminology or phraseology of the present disclosure is to be interpreted by those skilled in relevant art(s) in light of the teachings herein.

The above examples are illustrative, but not limiting, of the embodiments of this disclosure. Other suitable modifications and adaptations of the variety of conditions and parameters normally encountered in the field, and which would be apparent to those skilled in the relevant art(s), are within the spirit and scope of the disclosure.

While specific embodiments of the disclosure have been described above, it will be appreciated that embodiments of the present disclosure may be practiced otherwise than as described. The descriptions are intended to be illustrative, not limiting. Thus it will be apparent to one skilled in the art that modifications may be made to the disclosure as described without departing from the scope of the claims set out below.

It is to be appreciated that the Detailed Description section, and not the Summary and Abstract sections, is intended to be used to interpret the claims. The Summary and Abstract sections may set forth one or more but not all exemplary embodiments of the present disclosure as contemplated by the inventor(s), and thus, are not intended to limit the present disclosure and the appended claims in any way.

The present disclosure has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein.

The breadth and scope of the protected subject matter should not be limited by any of the above-described exemplary embodiments, but should be defined only in accordance with the following claims and their equivalents.

The invention claimed is:

1. A method comprising:
   disposing a sacrificial layer on a burled surface;
   disposing a transparent confining layer on the sacrificial layer, the transparent confining layer being at least partially transparent to radiation;
   treating the burled surface of an object using radiation or heat; and
   setting parameters of the radiation or heat to effectuate a predetermined surface strength, hardness, roughness, coefficient of friction, chemical resistance, wear resistance, and/or corrosion of the burled surface.

2. The method of claim 1, wherein the treating comprises transmitting the radiation through the transparent confining layer to irradiate the sacrificial layer and the method further comprises:
   disintegrating the sacrificial layer based on the irradiating the sacrificial layer to generate a shockwave;
   directing the shockwave toward the burled surface using the transparent confining layer to confine disintegrated material of the sacrificial layer; and
   increasing a packing density of molecules of the burled surface based on the directing the shockwave.

3. The method of claim 1, wherein:
   the treating comprises interacting the radiation or heat directly with the burled surface without first passing the radiation or heat through another material; and
   the parameters of the radiation or heat are selected based on the burled surface comprising titanium, chromium, and/or diamond-like carbon.

4. The method of claim 1, wherein the setting parameters of the radiation or heat comprises setting exposure time, pulsing, pulse length, amplitude, magnitude, repetition rate, wavelength, focus spot size, focus spot shape, pulse energy, pulse peak power, average power, pulse-to-pulse time, scan speed, scan pitch, and/or scanning pattern.

5. The method of claim 1, further comprising using an electrostatic clamp, a support table, or the electrostatic clamp and the support table as the object, wherein the treating comprises treating the burled surface using a laser.

6. A support table comprising:
   a burled surface comprising a transparent confining layer on a sacrificial layer on a contact layer, the transparent confining layer being at least partially transparent to a beam of radiation, and the contact layer being configured to be treated to effectuate a predetermined surface strength, hardness, roughness, coefficient of friction, chemical resistance, wear resistance, and/or corrosion of the contact layer;
   wherein the contact layer has been treated based on exposure to the beam of radiation or exposure to heat such that a parameter of the contact layer is greater than a same parameter of a reference layer having a same construction as the contact layer but without exposure to the beam of radiation or heat.

7. The support table of claim 6, further comprising an electrostatic clamp comprising the burled surface, wherein:
   the parameter of the contact layer comprises hardness and/or wear-resistance; and
   the contact layer comprises titanium, chromium, and/or diamond-like carbon.

8. The support table of claim 6, wherein the contact layer has been treated based on transmission of radiation through the transparent confining layer to irradiate the sacrificial layer, disintegrating the sacrificial layer based on the irradiating the sacrificial layer to generate a shockwave, and directing the shockwave toward the burled surface using the transparent confining layer to confine disintegrated material of the sacrificial layer.

9. A lithographic apparatus comprising:
   an illumination system configured to illuminate a pattern of a patterning device;
   a projection system configured to project an image of the pattern onto a substrate; and
   a support table comprising:
      a burled surface comprising a transparent confining layer on a sacrificial layer on a contact layer, the transparent confining layer being at least partially transparent to a beam of radiation, and the contact layer being configured to be treated to effectuate a predetermined surface strength, hardness, roughness, coefficient of friction, chemical resistance, wear resistance, and/or corrosion of the contact layer;
      wherein the contact layer has been treated based on exposure to the beam of radiation or exposure to heat such that a parameter of the contact layer is greater than a same parameter of a reference layer having a same construction as the contact layer but without exposure to the beam of radiation or heat.

10. The lithographic apparatus of claim 9, further comprising an electrostatic clamp comprising the burled surface, wherein:
   the parameter of the contact layer comprises hardness and/or wear-resistance; and
   the contact layer comprises titanium, chromium, and/or diamond-like carbon.

11. The lithographic apparatus of claim 9, wherein the support table is configured to support the substrate or the support table is configured to support the patterning device.

12. The lithographic apparatus of claim 9, wherein the contact layer has been treated based on transmission of radiation through the transparent confining layer to irradiate the sacrificial layer, disintegrating the sacrificial layer based on the irradiating the sacrificial layer to generate a shockwave, and directing the shockwave toward the burled surface using the transparent confining layer to confine disintegrated material of the sacrificial layer.

* * * * *